United States Patent
Furuya et al.

(10) Patent No.: US 12,344,930 B2
(45) Date of Patent: Jul. 1, 2025

(54) DEPOSITION METHOD AND DEPOSITION APPARATUS

(71) Applicant: Tokyo Electron Limited, Tokyo (JP)

(72) Inventors: Yuichi Furuya, Yamanashi (JP); Kohichi Satoh, Yamanashi (JP); Masato Araki, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 92 days.

(21) Appl. No.: 18/002,950

(22) PCT Filed: Jun. 23, 2021

(86) PCT No.: PCT/JP2021/023771
§ 371 (c)(1),
(2) Date: Dec. 22, 2022

(87) PCT Pub. No.: WO2022/004520
PCT Pub. Date: Jan. 6, 2022

(65) Prior Publication Data
US 2023/0272523 A1    Aug. 31, 2023

(30) Foreign Application Priority Data
Jul. 1, 2020   (JP) .................................. 2020-114371

(51) Int. Cl.
*C23C 16/16* (2006.01)
*C23C 16/44* (2006.01)
*C23C 16/448* (2006.01)
*C23C 16/455* (2006.01)

(52) U.S. Cl.
CPC .......... *C23C 16/16* (2013.01); *C23C 16/4401* (2013.01); *C23C 16/4481* (2013.01); *C23C 16/45561* (2013.01)

(58) Field of Classification Search
CPC ..................... C23C 16/45561; C23C 16/4401
See application file for complete search history.

(56) References Cited

FOREIGN PATENT DOCUMENTS

| JP | 2006-057112 | | 3/2006 |
|---|---|---|---|
| JP | 2006057112 | A * | 3/2006 |
| JP | 2008-244298 | | 10/2008 |
| JP | 2020-013966 | | 1/2020 |

OTHER PUBLICATIONS

English Translation of JP 2006057112, no date.*

* cited by examiner

Primary Examiner — Alex A Rolland
(74) Attorney, Agent, or Firm — IPUSA, PLLC

(57) ABSTRACT

A deposition method performed using a deposition apparatus is provided. The deposition apparatus includes: a source line configured to supply $Ru_3(CO)_{12}$ contained in a raw material container into a chamber; a CO gas line configured to supply a CO gas into the raw material container; a bypass line connecting the source line and the CO gas line, and forming a line that does not pass through the raw material container; and a first valve connected to the source line. The deposition method includes: opening the first valve to supply $Ru_3(CO)_{12}$ and the CO gas from the raw material container through the source line;
and controlling a pressure in the source line such that the pressure in the source line is a predetermined first pressure or more, and closing the first valve to stop supplying of $Ru_3(CO)_{12}$ and the CO gas to the chamber.

3 Claims, 8 Drawing Sheets

FIG.4

| TMP | CO PARTIAL PRESSURE CONTROL | NUMBER OF PARTICLES |
|---|---|---|
| NORMAL TMP | WITH CONTROL (COMPARATIVE EXAMPLE 1) | MAXIMUM OF 74 |
| LARGE TMP | WITH CONTROL (COMPARATIVE EXAMPLE 2) | MAXIMUM OF 137 |
| LARGE TMP | WITHOUT CONTROL (PRESENT EMBODIMENT) | 43 |

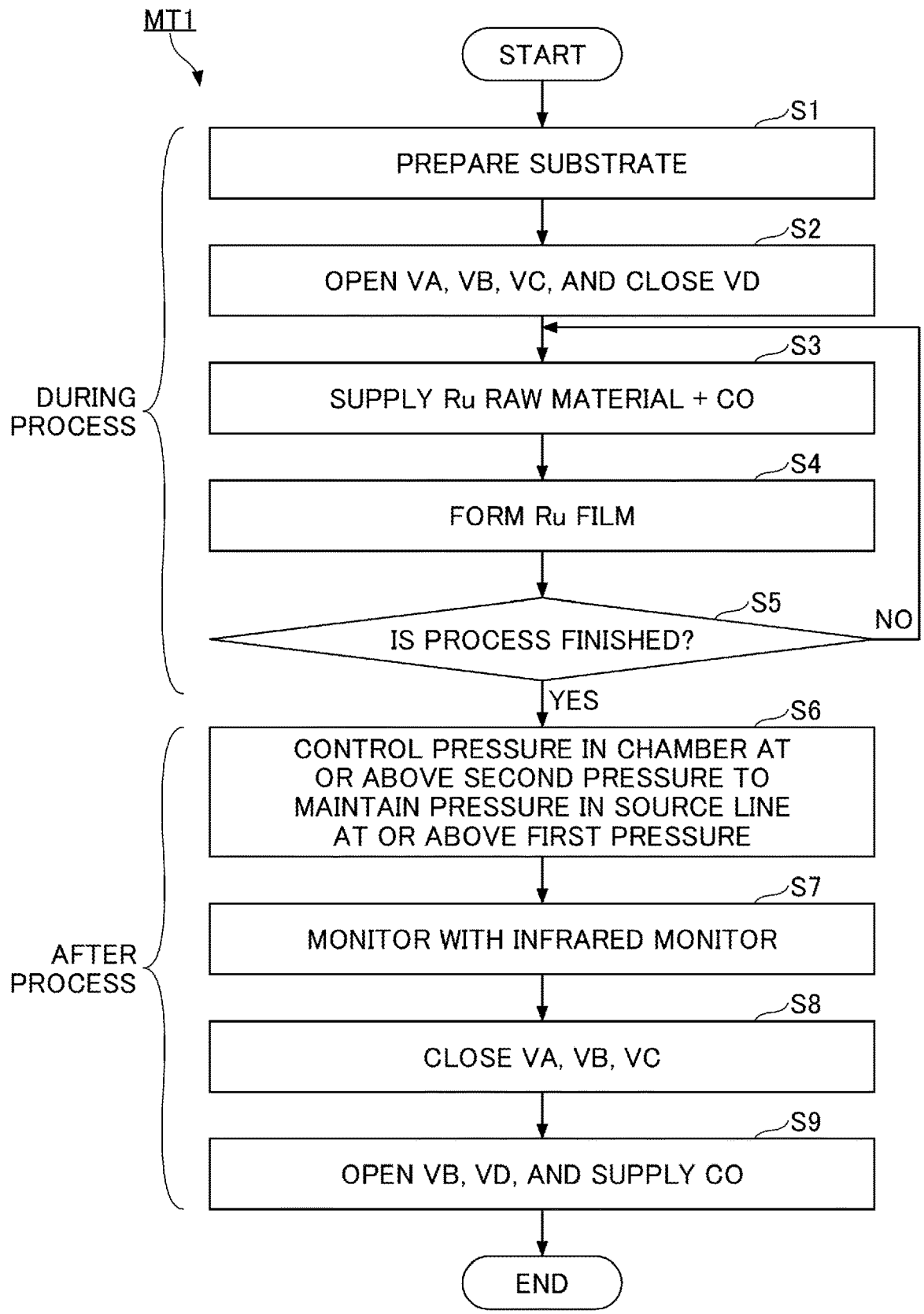

DEPOSITION METHOD AND DEPOSITION APPARATUS

TECHNICAL FIELD

The present invention relates to a deposition method and a deposition apparatus.

BACKGROUND ART

For example, PTL 1 discloses that $Ru_3(CO)_{12}$ tends to decompose relatively easily and precipitate ruthenium (Ru), and that decomposition of $Ru_3(CO)_{12}$ is accelerated when the partial pressure of CO, which is a reactant in the decomposition reaction of $Ru_3(CO)_{12}$, is low. It is proposed that the decomposition reaction of $Ru_3(CO)_{12}$ is suppressed by adding CO to the atmosphere in which $Ru_3(CO)_{12}$ is transported and controlling the partial pressure thereof.

CITATION LIST

Patent Literature

[PTL 1]
Japanese Laid-Open Patent Publication No. 2008-244298

SUMMARY OF INVENTION

Technical Problem

The present disclosure provides a technique for reducing particles.

Solution to Problem

One aspect of the present disclosure provides: a deposition method performed using a deposition apparatus. The deposition apparatus includes: a source line configured to supply $Ru_3(CO)_{12}$ as a raw material contained in a raw material container into a chamber; a CO gas line configured to supply a CO gas as a carrier gas into the raw material container; a bypass line connecting the source line and the CO gas line, and forming a line that does not pass through the raw material container; and a first valve connected to the source line. The deposition method includes: (a) opening the first valve to supply $Ru_3(CO)_{12}$ and the CO gas from the raw material container through the source line, thereby forming a ruthenium film on a substrate in the chamber; and (b) controlling, after completing (a), a pressure in the source line such that the pressure in the source line is a predetermined first pressure or more, and closing the first valve to stop supplying of $Ru_3(CO)_{12}$ and the CO gas to the chamber.

Advantageous Effects of Invention

According to one aspect of the present disclosure, particles can be reduced.

BRIEF DESCRIPTION OF THE DRAWINGS

FIG. 4 is a diagram illustrating an example of the results of the control of the partial pressure of CO by the deposition method according to an embodiment;

FIG. 5 is a flow diagram illustrating an example of a deposition method performed by a deposition apparatus according to an embodiment;

DESCRIPTION OF EMBODIMENTS

Figure 1:
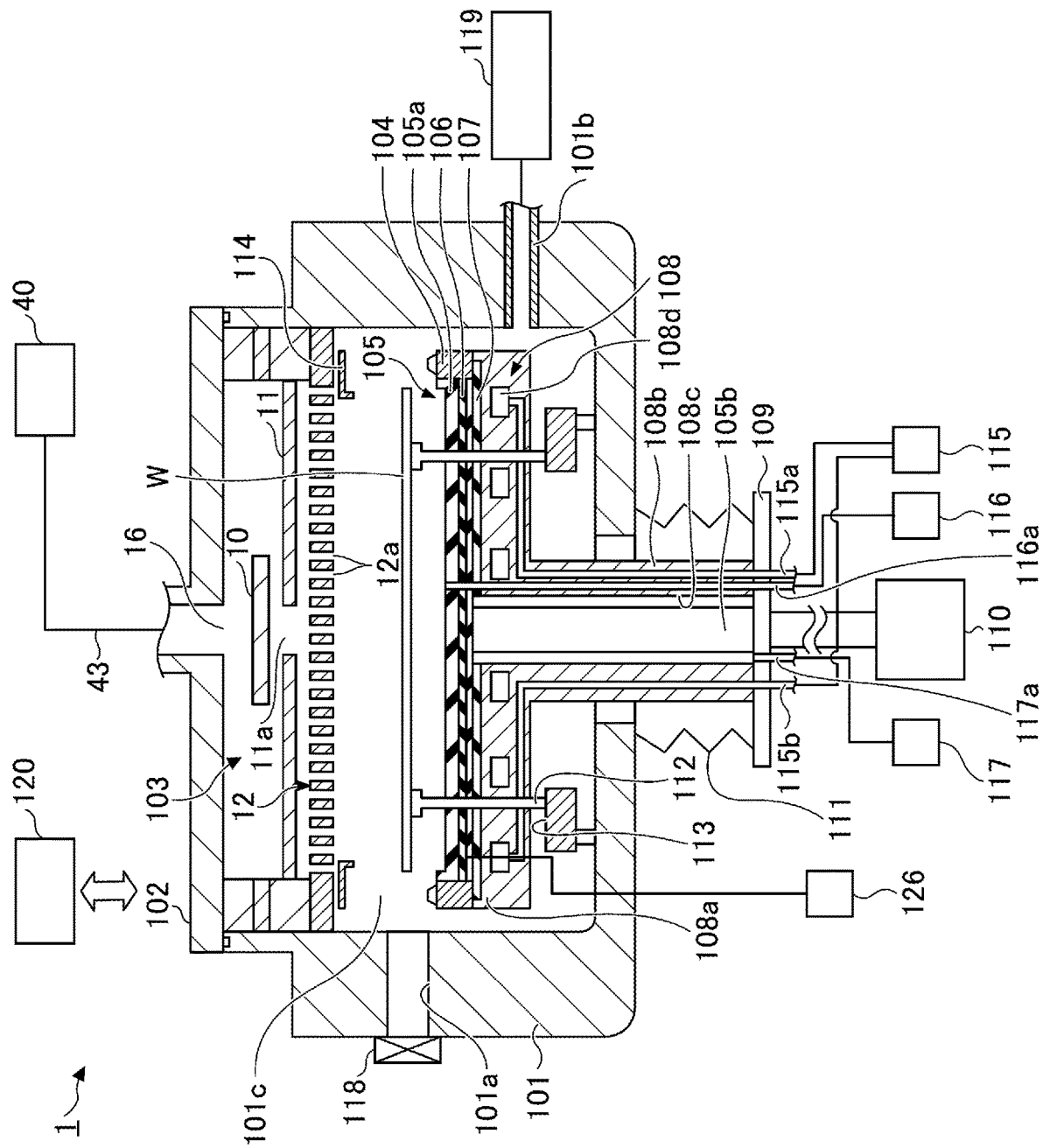
FIG. 1 is a schematic cross-sectional diagram illustrating an example of a deposition apparatus according to an embodiment.

In the following, embodiments for carrying out the present disclosure will be described with reference to the drawings. In each drawing, the same components are indicated by the same reference numerals and overlapping descriptions may be omitted.

Figure 2:
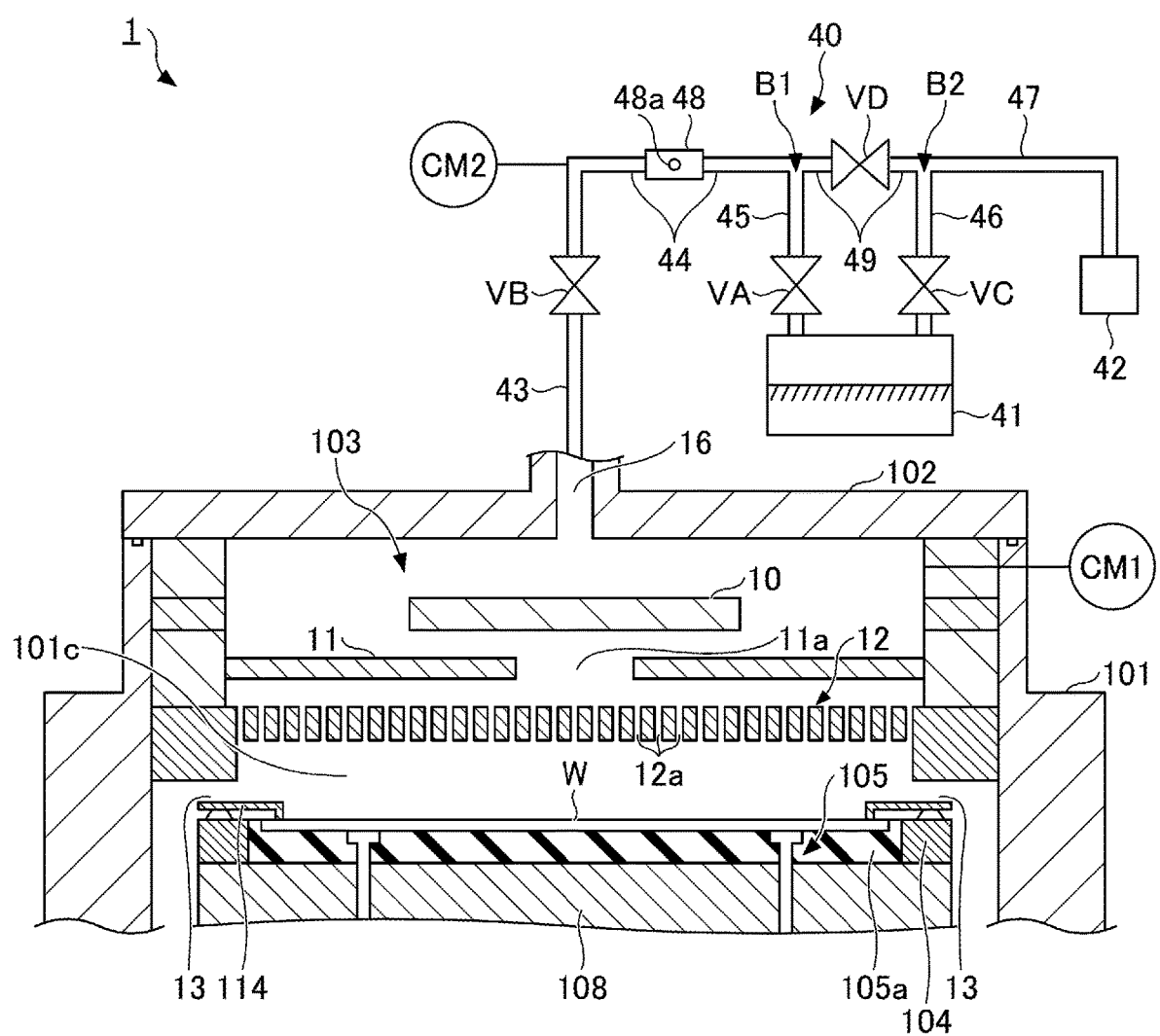
FIG. 2 is a diagram illustrating a configuration example of a gas supply according to an embodiment.

First, a configuration example of a deposition apparatus 1 according to an embodiment of the present disclosure will be described with reference to FIGS. 1 and 2. FIG. 1 is a schematic cross-sectional diagram illustrating the deposition apparatus 1 according to an embodiment at a processing position. FIG. 2 is a schematic cross-sectional diagram of the deposition apparatus 1 according to an embodiment at a transfer position, and a diagram illustrating a configuration example of a gas supply.

The deposition apparatus 1 is a CVD (Chemical Vapor Deposition) apparatus, and is an apparatus for depositing a ruthenium film, for example. For example, a ruthenium film is deposited on a substrate W by supplying a process gas containing a ruthenium-containing gas (a source gas, precursor) such as triruthenium dodecycarbonyl $Ru_3(CO)_{12}$ and a carrier gas such as CO.

The deposition apparatus 1 has a chamber 101. The chamber 101 is a bottomed container having an opening at the top. The inside of the chamber 101 is made into a vacuum atmosphere during deposition of the film. The chamber 101 has therein a mount 105 for mounting a substrate W, an example of which is a wafer, and a gas discharge mechanism 103 provided in the upper part of the chamber 101 so as to face the mount 105 for supplying gas to the surface of the substrate W. The gas discharge mechanism 103 defines a space in which gas is introduced.

A gas inlet 16 is provided in the center of the ceiling of the gas discharge mechanism 103. The gas inlet 16 is connected to a gas supply 40 through a gas line 43 to introduce the process gas containing the source gas and the carrier gas into the gas discharge mechanism 103. In the present embodiment, the source is $Ru_3(CO)_{12}$ and the carrier gas is CO gas.

Inside the gas discharge mechanism 103, a first plate member 10, a second plate member 11, and a shower plate 12 are provided in this order from the top. The first plate member 10, the second plate member 11, and the shower plate 12 are all disc-like members, and are provided in the gas discharge mechanism 103 so as to face the mount 105, and be substantially parallel to each other and separated in the horizontal direction. The process gas introduced from the gas inlet 16 flows to the outer peripheral side of the first plate member 10, passes through an opening 11a in the center of the second plate member 11, and is supplied into a processing chamber 101c through a plurality of gas holes 12a provided in the shower plate 12.

The support member 102 supports the gas discharge mechanism 103. When the support member 102 blocks the opening at the top of the chamber 101, the chamber 101 is sealed and the processing chamber 101c is formed.

The mount 105 includes a plate 105a formed into a flat disc shape using, for example, aluminum nitride, quartz, and the like as a material. Inside the mount 105, a heater 106 is embedded as an example of a heating means for heating the substrate W. The heater 106 is composed of, for example, a sheet-like resistance heating element. The heater 106 is supplied with power from a power supply 126 provided outside the chamber 101 to generate heat, and heats the mounting surface of the mount 105, thereby raising the substrate W to a predetermined process temperature suitable for deposition. The heater 106 heats the substrate W mounted on the mount 105 to, for example, 130° C. to 300° C.

The mount 105 has a support member 105b that extends downward from the center of the lower surface of the mount 105 and penetrates the bottom of the chamber 101. One end of the support member 105b is supported by a lifting mechanism 110 via a lifting plate 109.

A temperature control jacket 108 is provided as a temperature control member at the lower part of the mount 105. The temperature control jacket 108 includes a plate 108a having approximately the same size as the mount 105 on its upper portion, and a shaft 108b having a larger diameter than the support member 105b on its lower portion. The temperature control jacket 108 is formed with a hole 108c extending vertically in the center through the plate 108a and the shaft 108b. The temperature control jacket 108 houses the support member 105b in the hole 108c.

In the temperature control jacket 108, a refrigerant passage 108d is formed inside the plate 108a, and two refrigerant lines 115a and 115b are provided inside the shaft 108b. The refrigerant passage 108d has one end connected to the refrigerant line 115a and the other end connected to the refrigerant line 115b. The refrigerant lines 115a and 115b are connected to a refrigerant unit 115.

The refrigerant unit 115 is, for example, a chiller unit. The refrigerant unit 115 supplies refrigerant at a predetermined temperature from the refrigerant line 115a to the refrigerant passage 108d. The refrigerant supplied to the refrigerant passage 108d returns to the refrigerant unit 115 through the refrigerant line 115b. The temperature control jacket 108 is capable of temperature control by circulating a refrigerant, such as cooling water, in the refrigerant passage 108d.

A heat insulating ring 107 is disposed, as an insulation member, between the mount 105 and the temperature control jacket 108. The heat insulating ring 107 is made of, for example, SUS 316, A5052, Ti (titanium), ceramics, or the like and formed into a disk shape.

The shaft 108b of the temperature control jacket 108 penetrates the bottom of the chamber 101. The lower end of the temperature control jacket 108 is supported by the lifting mechanism 110 via the lifting plate 109 located below the chamber 101. A bellows 111 is provided between the bottom of the chamber 101 and the lifting plate 109, so that the chamber 101 is kept airtight even when the lifting plate 109 moves up and down.

The lifting mechanism 110 raises and lowers the lifting plate 109 to control the distance between the shower plate 12 and the mount 105. The side wall of the chamber 101 is provided with a transfer port 101a for carrying in and out the substrate W, and a gate valve 118 for opening and closing the transfer port 101a. In FIG. 1, the mount 105 is at a transfer position where the substrate W is transferred to and from an external transfer mechanism through the transfer port 101a. In FIG. 2, the mount 105 is at a processing position where processing of the substrate W is performed.

A lifting pin 112 supports the substrate W from the lower surface and lifts the substrate W from the mounting surface of the mount 105 when the substrate W is transferred to and from the external transfer mechanism. The mount 105 and the temperature control jacket 108 are formed with a through hole through which a shaft of the lifting pin 112 is inserted. An abutting member 113 is disposed below the lifting pin 112.

When the mount 105 is moved to the processing position (see FIG. 2) of the substrate W, the head of the lifting pin 112 is housed in the mount 105, and the substrate W is mounted on the mounting surface of the mount 105.

An annular member 114 is positioned above the mount 105. As illustrated in FIG. 2, when the mount 105 is moved to the processing position of the substrate W, the annular member 114 contacts the outer periphery of the upper surface of the substrate W and presses the substrate W against the mounting surface of the mount 105 by the self-weight of the annular member 114. When the mount 105 is moved to the transfer position (see FIG. 1) of the substrate W, the annular member 114 is locked by a locking portion (not illustrated) above the transfer port 101a, so that the transfer of the substrate W by the transfer mechanism is not hindered.

A heat transfer gas supply 116 in FIG. 1 supplies a heat transfer gas, such as, for example, He gas, between the rear surface of the substrate W mounted on the mount 105 and the mounting surface of the mount 105, through a line 116a and flow passages (not illustrated) formed in the temperature control jacket 108 and in the mount 105.

A purge gas supply 117 passes through a gap formed between a line 117a, the support member 105b of the mount 105, and the hole 108c of the temperature control jacket 108, to supply a purge gas such as CO gas, between the lower surface of the annular member 114 and the upper surface of the mount 105. That is, the purge gas passed through the gap is supplied between the lower surface of the annular member 114 and the upper surface of the mount 105 through a flow passage formed between the mount 105 and the heat insulating ring 107 and extending radially outwardly and through a vertical flow passage formed on the outer periphery of the mount 105. This prevents the process gas from flowing into the space between the lower surface of the annular member 114 and the upper surface of the mount 105 and prevents the formation of a film on the lower surface of the annular member 114 or the upper surface of the outer periphery of the mount 105.

An exhaust section 119 including a turbomolecular pump (TMP) and a dry pump is connected to the lower side wall of the chamber 101 through an exhaust pipe 101b. The inside of the chamber 101 is evacuated by the exhaust section 119, and the inside of the processing chamber 101c is set and maintained at a predetermined vacuum atmosphere. A pressure gauge CM1 is provided on the chamber 101 to measure the pressure in the chamber 101 (see FIG. 2). The exhaust pipe 101b and the exhaust section 119 are located below the mount 105.

As illustrated in FIG. 2, an exhaust port 13 is formed outside the mount 105 in the radial direction for evacuating the processing chamber 101c. The mount 105 is engaged with a covering 104 on its outer periphery, and the annular member 114 positioned on the covering 104 presses the peripheral edge of the substrate W. Thus, the process gas is evacuated radially outwardly by the exhaust port 13 formed between the upper surface of the annular member 114 that presses the peripheral edge of the substrate W, and the lower surface of the shower plate 12. The exhaust port 13 is an opening provided between the upper surface of the annular member 114 and the lower surface of a protrusion provided on the outer periphery of the shower plate 12.

The deposition apparatus 1 may further include a controller 120. The controller 120 may be a computer including a processor, a storage unit such as a memory, an input device, a display device, an input/output interface of signals, and the like. The controller 120 controls each part of the deposition apparatus 1. For example, the controller 120 controls the operation of the deposition apparatus 1 by controlling the gas supply 40, the heater 106, the lifting mechanism 110, the refrigerant unit 115, the heat transfer gas supply 116, the purge gas supply 117, the gate valve 118, the exhaust section 119, and the like.

In the controller 120, the operator can use the input device to input commands and the like to manage the deposition apparatus 1. The controller 120 can visualize and display the operation status of the deposition apparatus 1 using the display device. The storage unit stores control programs and recipe data. The control program is executed by the processor in order to perform the deposition process in the deposition apparatus 1. The processor executes control programs and controls each part of the deposition apparatus 1 according to the recipe data.

[Gas Supply]

Next, the configuration of the gas supply 40 will be described with reference to FIG. 2. FIG. 2 is a diagram illustrating a configuration example of the gas supply 40 provided in the deposition apparatus 1 according to an embodiment. The gas supply 40 includes a raw material container 41, a CO gas source 42, a gas line 43, source lines 44 and 45, CO gas lines 46 and 47, a bypass line 49, and valves VA, VB, VC, and VD.

The CO gas source 42 is connected to the CO gas lines 46 and 47. The CO gas source 42 includes a mass flow controller or a pressure-controlled flow controller, and supplies the CO gas at a predetermined flow rate to the raw material container 41 through the CO gas lines 46 and 47.

The raw material container 41 houses $Ru_3(CO)_{12}$ as a raw material for the ruthenium film. The raw material container 41 includes a heating means such as a heater to heat and vaporize the solid raw material $Ru_3(CO)_{12}$. The raw material container 41 is connected to the source lines 44 and 45 and is connected to the chamber 101 through the gas line 43. The gas line 43 is part of a source line that supplies the source gas from the raw material container 41 to the chamber 101. Hereinafter, the lines including the gas line 43 are also referred to as the source lines 43 to 45.

The source gas of $Ru_3(CO)_{12}$ vaporized in the raw material container 41 is transported by the CO gas of the carrier gas to the source lines 43 to 45 and supplied onto the substrate W in the chamber 101. The deposition apparatus 1 may further supply a rare gas. The substrate W on the mount 105 is controlled to a predetermined temperature by the heater 106, and the $Ru_3(CO)_{12}$ supplied at a predetermined flow rate is thermally decomposed, thereby forming a ruthenium film.

The bypass line 49 connects the source lines 43 to 45 and the CO gas lines 46 and 47 to form a line for supplying the CO gas into the chamber 101 without passing through the raw material container 41. The valve VA is connected to the source line 45 on a position closer to the raw material container 41 than to a connection position B1 between the bypass line 49 and the source lines 43 to 45. The valve VA is an example of a first valve. The valve VD is connected to the bypass line 49. The valve VD is an example of a second valve.

The valve VB is connected to the source line 44 on a position closer to the chamber 101 than to the connection position B1 between the bypass line 49 and the source lines 43 to 45. The valve VB is an example of a third valve. The valve VC is connected to the CO gas line 46 on a position closer to the raw material container 41 than to a connection position B2 of the bypass line 49 and the CO gas lines 46 and 47.

An infrared monitor 48 is connected to the source lines 44 and 45 between the valve VA and the valve VB to monitor $Ru_3(CO)_{12}$ in the source lines 44 and 45. The infrared monitor 48 detects $Ru_3(CO)_{12}$ from the wavelength of $Ru_3(CO)_{12}$ by irradiating the source line 44 with infrared rays from the window 48a made of alumina, monitors the amount (flow rate) of $Ru_3(CO)_{12}$, and controls the partial pressure of the CO gas in the source line (hereinafter, referred to as "the partial pressure of CO") using the amount.

A pressure gauge CM2 is provided on the source lines 44 and 45 between the valve VA and the valve VB to measure the pressure inside the source lines 44 and 45. In the present embodiment, the pressure gauge CM2 is connected to the source line 44 and the pressure inside the source line 44 is measured by the pressure gauge CM2.

The amount of ruthenium relative to the CO gas in the source lines 44 and 45 is very small. Therefore, the pressure measured by the pressure gauge CM2 may be considered to be almost the partial pressure of CO. Accordingly, the controller 120 can control the partial pressure of CO in the source lines 44 and 45 by controlling the pressure inside the source lines 44 and 45 measured by the pressure gauge CM2 to be the predetermined first pressure or more. The controller 120 can also monitor the amount of the source gas of $Ru_3(CO)_{12}$ in the source lines 44 and 45 by the infrared monitor 48.

[Control of Partial Pressure of CO]

Next, control of the partial pressure of CO in the gas supply 40 will be described. Preferably, $Ru_3(CO)_{12}$ is present in a gaseous state in the raw material container 41 and in the source lines 43 to 45. However, $Ru_3(CO)_{12}$ decomposes relatively easily from the left to the right in a reaction formula (1) below, resulting in deposition of ruthenium (Ru) as indicated by the right of the reaction formula.

$$Ru_3(CO)_{12} \rightarrow 3Ru + 12CO \qquad (1)$$

A low partial pressure of CO accelerates the decomposition of $Ru_3(CO)_{12}$. When the chemical reaction proceeds from the left to the right of the reaction formula (1), fibrous ruthenium is deposited inside the raw material container 41 and inside the source lines 43 to 45, for example, and is transported through the source lines 43 to 45 to the chamber 101, and flies onto the substrate W to become a particle.

Figure 3:
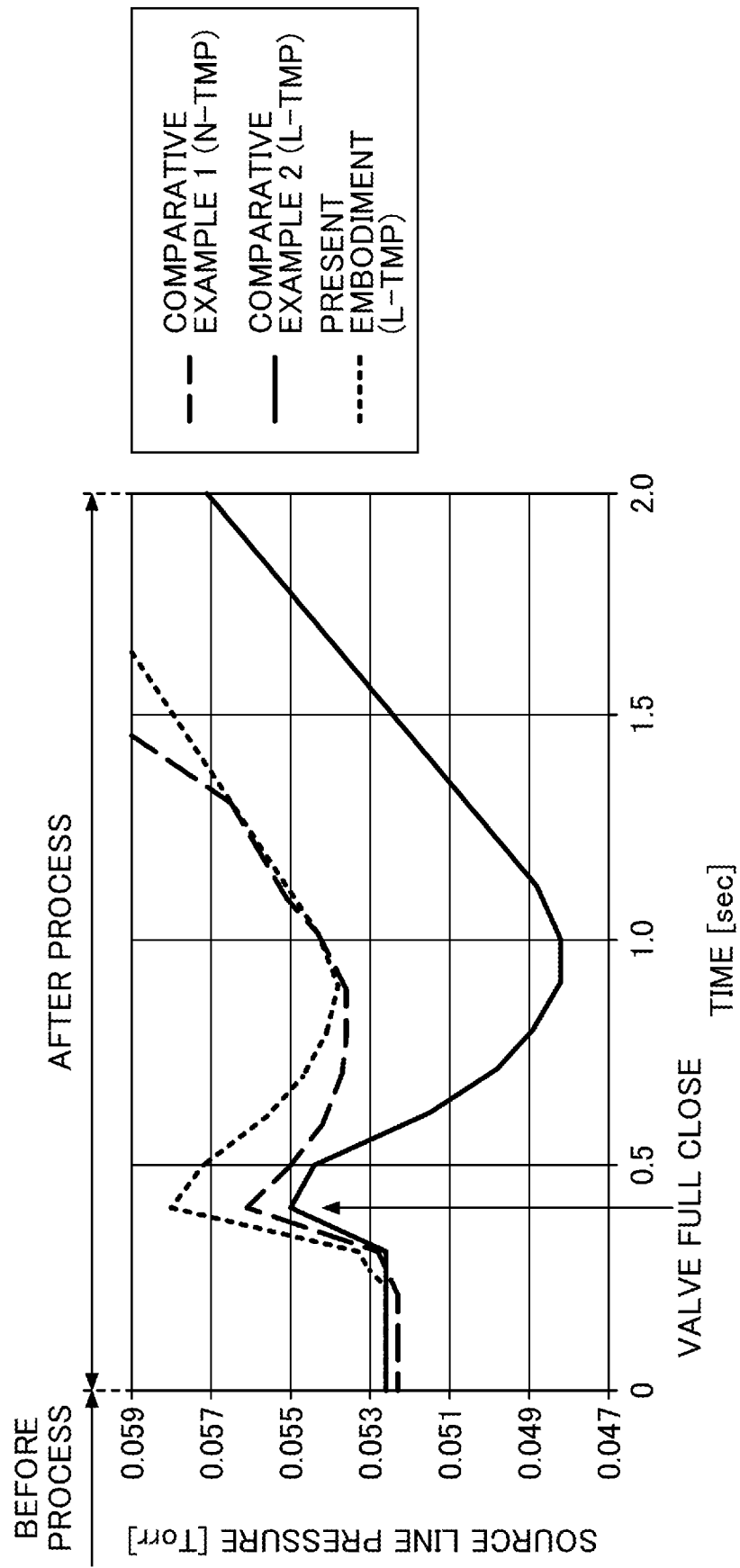
FIG. 3 is a diagram illustrating an example of the measurement results of the pressure in the source line after the deposition process according to an embodiment and Comparative Examples.

FIG. 3 illustrates an example of the measurement results of the pressure in the source lines 43 to 45 after the deposition process. In FIG. 3, time "0" on the horizontal axis indicates the end of the deposition process of the ruthenium film, and the vertical axis indicates the partial pressure of CO in the source lines 43 to 45. The partial pressure of CO in the source lines 43 to 45 is the pressure inside the source lines 43 to 45 measured by the pressure gauge CM2.

After the deposition process, the valves VA, VB, and VC as illustrated in FIG. 2 are closed at the timing indicated by "valve full close". When the valves VA, VB and VC are closed, the supply of the source gas and the CO gas to the chamber 101 are stopped.

Even after the supply of the source gas and the CO gas is stopped, the exhaust section 119 continues evacuating the chamber 101 so that the inside of the source lines 43 to 45 connected to the chamber 101 is also evacuated, lowering the pressure of CO in the source lines 43 to 45. Comparative Example 1 in FIG. 3 illustrates the pressure of CO in the source lines 43 to 45 when using normal TMP (N-TMP) for the turbomolecular pump of the exhaust section 119, and Comparative Example 2 illustrates the pressure of CO when using large TMP (L-TMP) for the turbomolecular pump of the exhaust section 119. Because the large TMP has a larger exhaust capacity than the normal TMP, in Comparative Example 2, the reduction in the pressure of CO in the source lines 43 to 45 is greater than in Comparative Example 1.

The deposition apparatus 1 according to the present embodiment controls the partial pressure of CO in the source lines 43 to 45 after the deposition process, and prevents a decrease in the partial pressure of CO in the source lines 43 to 45, thereby preventing the decomposition of $Ru_3(CO)_{12}$. This prevents the generation of ruthenium particles which are precipitated by decomposition of $Ru_3(CO)_{12}$.

Conventionally, the partial pressure of CO in the source lines 43 to 45 during the deposition process is controlled. In the present embodiment, in addition, the partial pressure of CO in the source lines 43 to 45 is controlled even after the deposition process. That is, after the deposition process, a pressure inside the source lines 43 to 45 is controlled such that the pressure is the first pressure or more. Specifically, in the present embodiment, the pressure inside the source lines 43 to 45 is maintained at the first pressure or more by controlling, after the deposition process, the pressure inside the chamber 101 to the second predetermined pressure or more. For example, the second pressure is preferably 0.0166 Torr (2.213 Pa). When the control is performed by setting the second pressure to 0.0166 T, the first pressure is set to 0.053 Torr (7.066 Pa). The first pressure may be a pressure equal to or higher than the pressure of the source lines during the deposition process before "valve full close" as illustrated in FIG. 3, for example.

By controlling the partial pressure of CO in the source lines 43 to 45, the decomposition of $Ru_3(CO)_{12}$ inside the source lines 43 to 45 and the decomposition of $Ru_3(CO)_{12}$ in the raw material container 41 are prevented, and the generation of the particles is reduced. In particular, in a case where the opening/closing operation of the valve VA and the valve VB is slower than the opening/closing operation of the valve VC, even when the controller 120 simultaneously closes the valve VA, the valve VB, and the valve VC at the timing indicated by "valve full close" in FIG. 3, the valve VC closes first. Then, the valve VA and the valve VB are closed. Due to this timing shift, the supply of the CO gas into the raw material container 41 is stopped first, and then the valve VA and the valve VB are closed. In this case, the partial pressure of CO inside the raw material container 41 and the source lines 43 to 45 is further reduced, and the partial pressure of CO inside the raw material container 41 and the source lines 43 to 45 is further reduced before the subsequent deposition process begins. This further accelerates the decomposition of $Ru_3(CO)_{12}$ in the raw material container 41 and the source lines 43 to 45. Therefore, according to the deposition method according to the present embodiment, a technique for preventing the decomposition of $Ru_3(CO)_{12}$ in the raw material container 41 and in the source lines 43 to 45 and reducing the particles, is provided.

FIG. 4 is a diagram illustrating an example of the results of the control of the partial pressure of CO by the deposition method according to the present embodiment. In the deposition method according to the present embodiment, after the deposition process, "control of partial pressure of CO" was performed in which the pressure inside the source lines 43 to 45 was maintained at the first pressure or more by controlling the pressure inside the chamber 101 to the predetermined second pressure or more. In contrast, in Comparative Examples 1 and 2, the control of the partial pressure of CO was not performed. As a result, in Comparative Examples 1 and 2, the decomposition of $Ru_3(CO)_{12}$ in the raw material container 41 and the source lines 43 and 45 was accelerated due to the decrease in the partial pressure of CO in the source lines 43 to 45. Particularly, in Comparative Example 2, the partial pressure of CO in the source lines 43 to 45 was further reduced because the large TMP having a larger exhaust capacity than the normal TMP of Comparative Example 1 was used. This further accelerated the decomposition of $Ru_3(CO)_{12}$ in the raw material container 41 and the source lines 43 to 45. As a result, the number of particles on the substrate W was up to 74 in Comparative Example 1 and up to 137 in Comparative Example 2, when measuring the number of particles for the plurality of substrates W after the deposition process. In contrast, in the deposition method according to the present embodiment, the number of particles was reduced to 43, which was the lowest, by the above-described control of the partial pressure of CO.

[Operation of Deposition Apparatus 1]

Figure 6A:
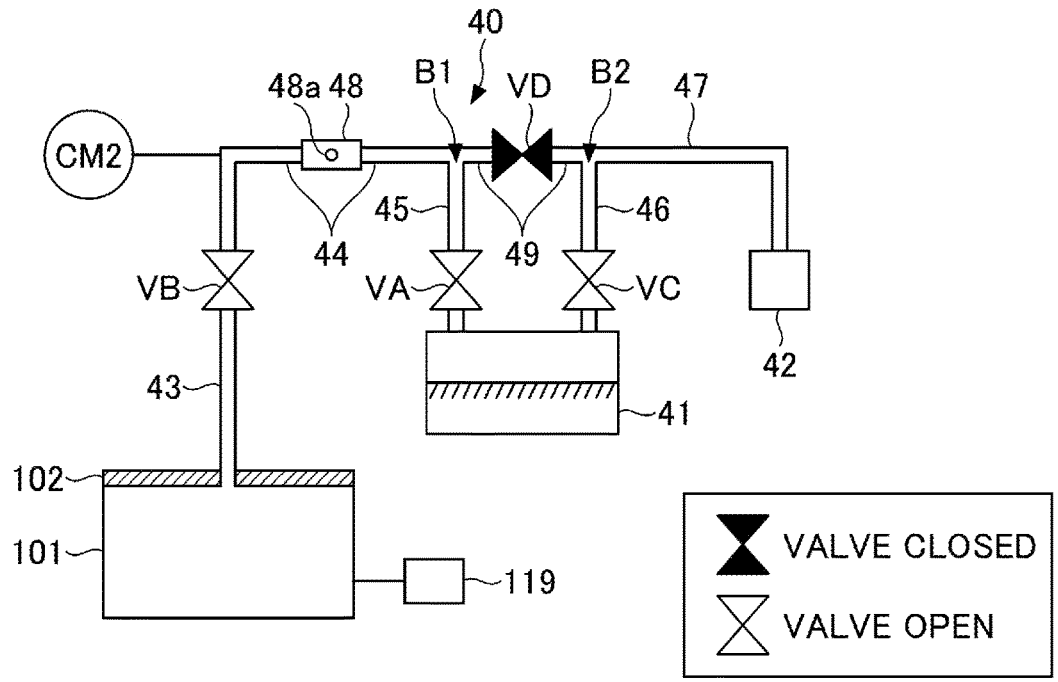
FIG. 6A is a diagram for explaining the state of "during process" of the deposition method in FIG. 5.
Figure 6B:
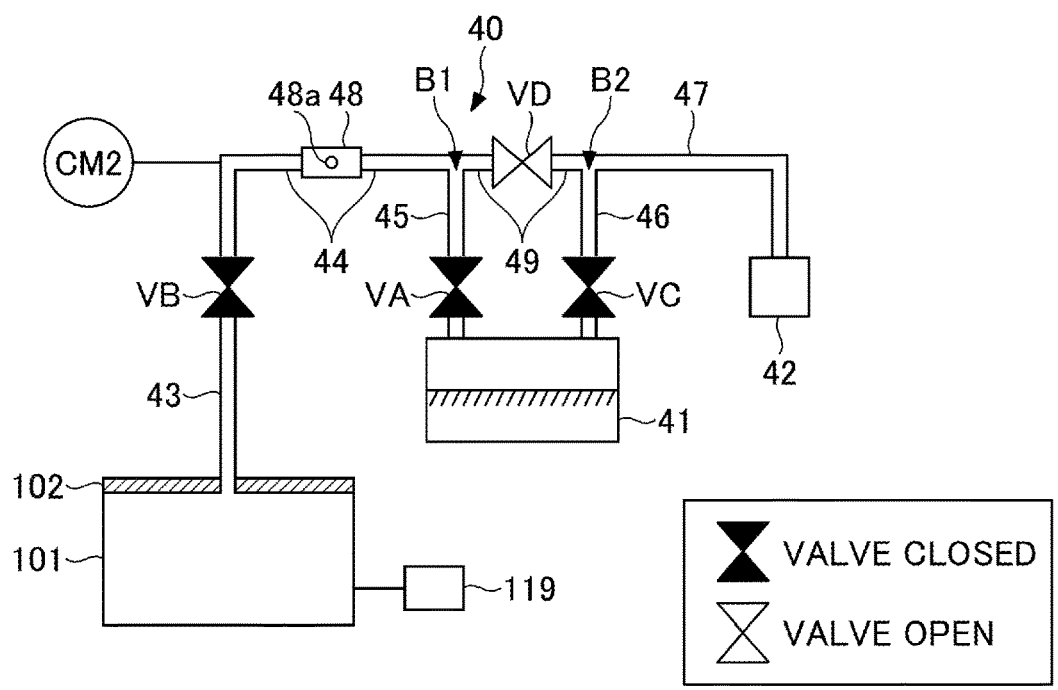
FIG. 6B is a diagram for explaining the state of "after process" of the deposition method in FIG. 5.

Next, an example of operation of the deposition apparatus 1 will be described with reference to FIGS. 5 and 6. FIG. 5 is a flow diagram illustrating an example of a deposition method MT1 performed by the deposition apparatus 1 according to the embodiment. FIG. 6A is a diagram for explaining the state of "during process" of the deposition method MT1 in FIG. 5. FIG. 6B is a diagram for explaining the state of "after process" of the deposition method MT1 in FIG. 5. The deposition method MT1 is controlled by the controller 120. At the start, the inside of the chamber 101 is in a vacuum atmosphere by the exhaust section 119. The mount 105 is moved at a transfer position.

When the method MT1 is started, a substrate is prepared (step S1). In step S1, the gate valve 118 is first opened and the substrate W is placed on the lifting pin 112 by the external transfer mechanism. When the transfer mechanism exits the transfer port 101a, the gate valve 118 is closed. The lifting mechanism 110 is controlled such that the mount 105 is moved to the processing position. At this time, when the mount 105 is raised, the substrate W mounted on the lifting pin 112 is mounted on the mounting surface of the mount 105. Further, the annular member 114 contacts the outer periphery of the upper surface of the substrate W and presses the substrate W to the mounting surface of the mount 105 by the own weight of the annular member 114. Accordingly, a process space is formed in the processing chamber 101c above the mount 105.

The controller 120 operates the heater 106 and controls the gas supply 40 such that the valve VA, the valve VB, and the valve VC are opened, and the valve VD is closed (step S2). Thus, the CO gas is supplied from the CO gas source 42 through the CO gas line 47 into the raw material container 41. $Ru_3(CO)_{12}$ in the raw material container 41 is heated and vaporized, and supplied into the chamber 101 through the source lines 43 to 45 using the CO gas as a carrier gas (step S3). In step S4, a ruthenium film is formed on the substrate W by $Ru_3(CO)_{12}$ and the CO gas supplied into the processing chamber 101c. After the processing, the gases pass through the exhaust port 13 on the upper side of the annular member 114 from the processing chamber 101c, and are exhausted through the exhaust pipe 101b by the exhaust section 119.

Next, in step S5, it is determined whether or not the deposition process is completed. When it is determined that the deposition process is not completed, the process returns to step S3, and the deposition process of steps S3 to S5 continues. In contrast, when it is determined that the deposition process is completed, the source lines 43 to 45 are maintained at the first pressure or more by controlling the pressure inside the chamber 101 to the predetermined second pressure or more (step S6).

Next, the amount of $Ru_3(CO)_{12}$ in the source lines 44 and 45 is monitored using the infrared monitor 48 (step S7). Based on the monitoring result, the partial pressure of CO inside the source lines 43 to 45 is controlled.

Next, the valve VA, the valve VB, and the valve VC are closed (step S8) in a state where the source lines 43 to 45 are maintained at the first pressure or more. Thus, the supply of the source gas of $Ru_3(CO)_{12}$ and the CO gas into the processing chamber 101c is stopped. At this time, the partial pressure of CO inside the source lines 43 to 45 is controlled so that the decomposition of $Ru_3(CO)_{12}$ is prevented. This prevents the decomposition of $Ru_3(CO)_{12}$ in the source lines 43 to 45 and in the raw material container 41, and reduces the particles.

Next, the valve VB and the valve VD are opened, and the CO gas is supplied into the chamber 101 through the CO gas line 47, the bypass line 49, and the source lines 43 to 45 (step S9). By supplying the CO gas into the chamber 101, residual CO gas after the deposition process can be exhausted from the inside of the source lines 43 to 45, for each deposition process of each substrate W.

As described above, the deposition method MT1 according to the present embodiment has been described. According to the method, the valve VA, the valve VB, and the valve VC are opened, and the valve VD is closed during the deposition process, as illustrated in FIG. 6A (FIG. 5: S2).

After the deposition process is completed, as illustrated in FIG. 6B, the pressure in the source lines 43 to 45 are maintained at the first pressure or more by setting the pressure inside the chamber 101 to the second pressure or more (FIG. 5: S6), before closing the valve VA, the valve VB, and the valve VC (FIG. 5: S8). This prevents the decomposition of $Ru_3(CO)_{12}$ in the source lines 43 to 45 and in the raw material container 41, and reduces the particles.

After the processing in steps S6 to S9 is performed, the substrate W is carried out from the chamber 101. When the substrate W is carried out, the lifting mechanism 110 is controlled such that the mount 105 is moved to a receiving position. When the lower end of the lifting pin 112 abuts against the abutting member 113, the head of the lifting pin 112 protrudes from the mounting surface of the mount 105 and lifts the substrate W from the mounting surface of the mount 105.

Next, the gate valve 118 is opened and the substrate W mounted on the lifting pin 112 is carried out by the external transfer mechanism. When the transfer mechanism exits the transfer port 101a, the gate valve 118 is closed.

[Other Operation of Deposition Apparatus 1]

Figure 7:
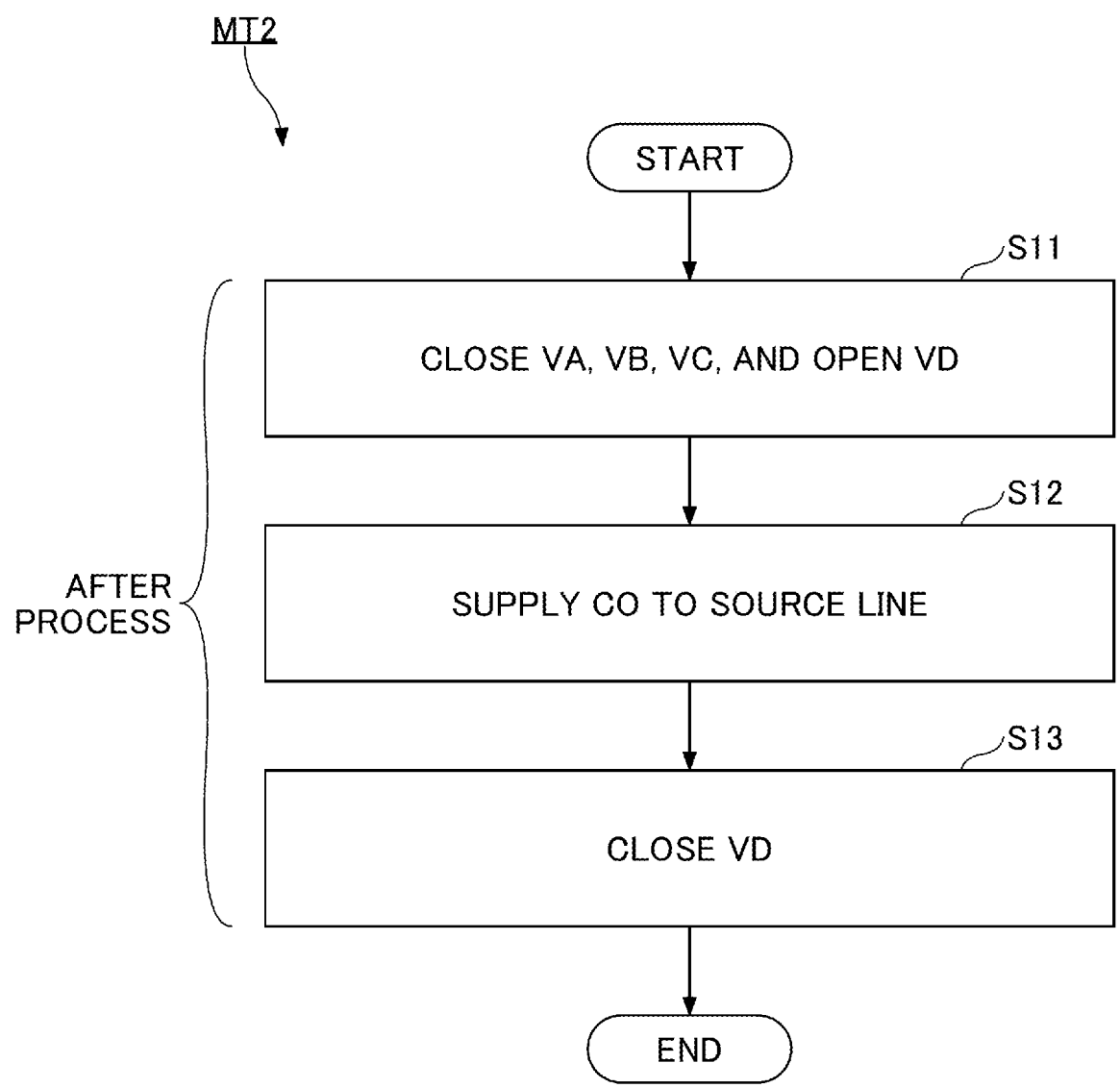
FIG. 7 is a flow diagram illustrating an example of the deposition method performed by the deposition apparatus according to an embodiment.
Figure 8A:
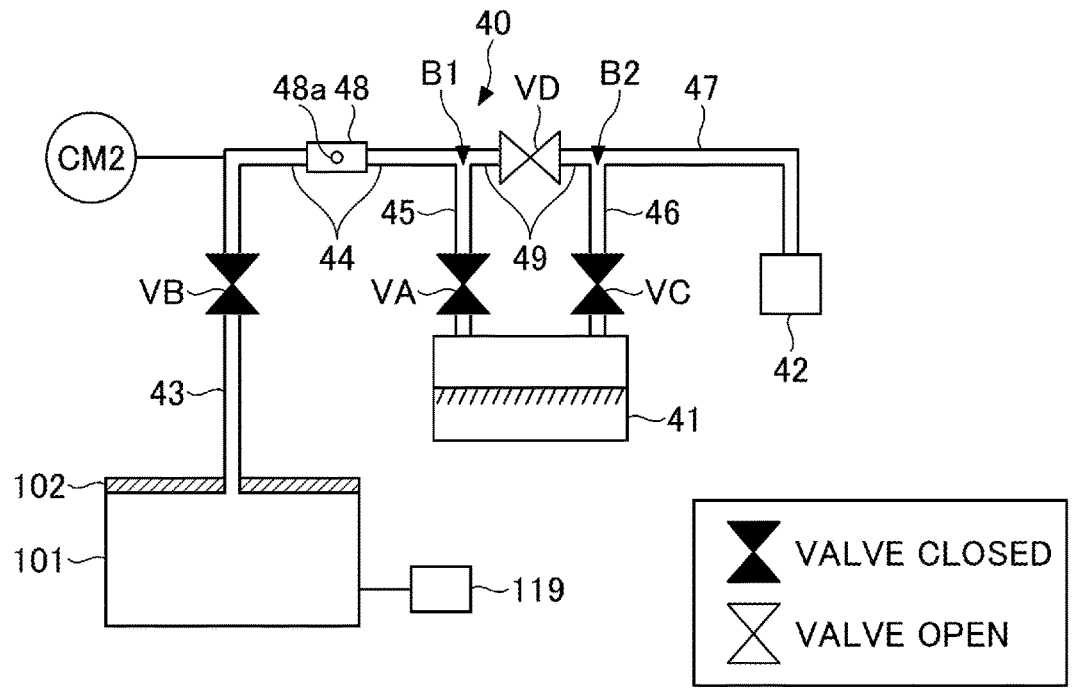
FIG. 8A is a diagram for explaining the state of "after process" of the deposition method in FIG. 7.
Figure 8B:
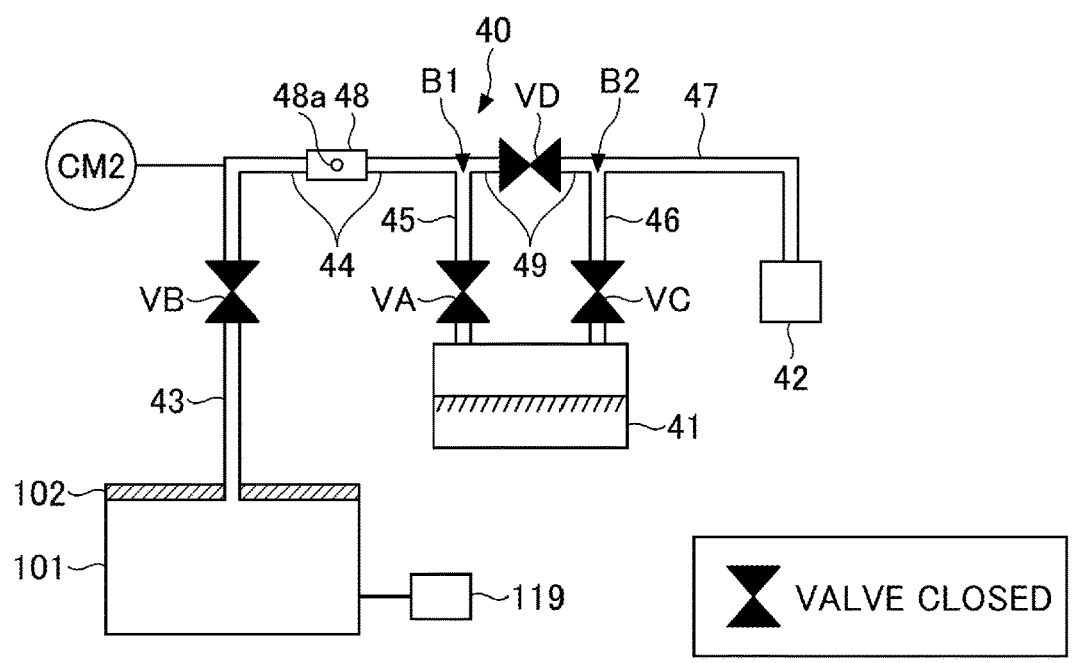
FIG. 8B is a diagram for explaining the state of "after process" of the deposition method in FIG. 7.

Next, another operation of the deposition apparatus 1 will be described with reference to FIGS. 7 and 8. FIG. 7 is a flow diagram illustrating an example of a deposition method MT2 performed by the deposition apparatus 1 according to an embodiment. FIG. 8A is a diagram for explaining the state of "after process" of the deposition method MT2 in FIG. 7. FIG. 8B is a diagram for explaining the state of "after process" of the method MT2 in FIG. 7. The deposition method MT2 is controlled by the controller 120. The deposition method MT2 of FIG. 7 may be performed after executing the deposition method MT1 of FIG. 5. The deposition method MT2 can be performed while the deposition process is not being performed.

When the method MT2 is started, the gas supply 40 is controlled such that the valve VA, the valve VB, and the valve VC are closed and the valve VD is opened, as illustrated in FIG. 8A (step S11). Thus, the CO gas is supplied to the source lines 44 and 45 between the valve VA and the valve VB from the CO gas source 42 through the CO gas line 47 and the bypass line 49 (step S12).

After the CO gas is supplied to the source lines 44 and 45, as illustrated in FIG. 8B, the valve VD is closed, and the CO gas is contained inside the source lines 44 and 45 (step S13). Accordingly, the CO gas is injected into the source lines 44 and 45, thereby preventing the decomposition of $Ru_3(CO)_{12}$ inside the source lines 44 and 45, and reducing the particles.

The inside of the source lines 43 to 45 is evacuated after the deposition process of each substrate W to prevent $Ru_3(CO)_{12}$ from being left in the source lines 43 to 45. However, it takes a considerable amount of time to sufficiently evacuate the source lines 43 to 45, which reduces the throughput. To cope with this, by performing the deposition method MT2 between the deposition processes, the CO gas is contained inside the source lines 44 and 45, and the partial pressure of CO is increased. This prevents the decomposition of $Ru_3(CO)_{12}$ inside the source lines 44 and 45, and reduces the particles.

The deposition method and the deposition apparatus according to the embodiments disclosed herein should be considered as examples in all respects and not restrictive. Embodiments can be modified and improved in various ways without departing from the appended claims and spirit thereof. The items described in the above embodiments may take other configurations within a range that is not inconsistent, and may be combined within a range that is not inconsistent.

For example, the deposition apparatus of the present disclosure may be an atomic layer deposition (ALD) device, a plasma ALD device, a thermal CVD device, a plasma CVD device, and the like.

The present application claims priority to Japanese Patent Application No. 2020-114371, filed Jul. 1, 2020, with the Japanese Patent Office, the contents of which are incorporated herein by reference in their entirety.

DESCRIPTION OF THE REFERENCE NUMERAL

1 Deposition Apparatus
12 Shower Plate
16 Gas Inlet
40 Gas Supply
41 Raw Material Container
42 CO Gas Source 43 Gas Line
44, 45 Source Line
46, 47 CO Gas Line
48 Infrared Monitor
49 Bypass Line
101 Chamber
101c Processing Chamber
105 Mount
106 Heater
120 Controller
VA, VB, VC, VD Valve
W Substrate

The invention claimed is:

1. A deposition method performed using a deposition apparatus, wherein the deposition apparatus includes:
   a source line configured to supply $Ru_3(CO)_{12}$ as a raw material contained in a raw material container into a chamber;
   a CO gas line configured to supply a CO gas as a carrier gas into the raw material container;
   a bypass line connecting the source line and the CO gas line, and forming a line that does not pass through the raw material container;
   a first valve connected to the source line at a position closer to the raw material container than to a connection position between the bypass line and the source line;
   a second valve connected to the bypass line; and
   a third valve connected to the source line at a position closer to the chamber than to the connection position between the bypass line and the source line,
   the deposition method comprising:
   (a) opening the first valve to supply $Ru_3(CO)_{12}$ and the CO gas from the raw material container through the source line, thereby forming a ruthenium film on a substrate in the chamber;
   (b) controlling, after completing (a), a pressure in the source line such that the pressure in the source line is a predetermined first pressure or more, and closing the first valve to stop supplying of $Ru_3(CO)_{12}$ and the CO gas to the chamber;
   (c) opening, after completing (b), the second valve in a state that the pressure in the source line is maintained at the first pressure or more to supply the CO gas through the bypass line to the chamber; and
   (d) closing, after completing (c), the third valve to inject the CO gas into the source line between the first valve and the third valve through the bypass line.

2. The deposition method according to claim 1, wherein, in (b), a pressure in the chamber is controlled such that the pressure in the chamber is a predetermined second pressure or more in order to maintain the pressure in the source line at the first pressure or more.

3. The deposition method according to claim 1,
   wherein in the deposition apparatus, an infrared monitor is connected to the source line between the first valve and the third valve, and
   wherein the deposition method includes:
   (e) monitoring $Ru_3(CO)_{12}$, which is a source gas, in the source line.

* * * * *